United States Patent
Jeon et al.

(10) Patent No.: US 10,475,501 B2
(45) Date of Patent: Nov. 12, 2019

(54) SEMICONDUCTOR DEVICE AND METHOD FOR PROFILING EVENTS IN SEMICONDUCTOR DEVICE

(71) Applicant: Samsung Electronics Co., Ltd., Suwon-si, Gyeonggi-do (KR)

(72) Inventors: Ho-Yeon Jeon, Hwaseong-si (KR); Ah Chan Kim, Hwaseong-si (KR); Min Joung Lee, Suwon-si (KR); Youn-Sik Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/946,992

(22) Filed: Apr. 6, 2018

(65) Prior Publication Data
US 2019/0057733 A1    Feb. 21, 2019

(30) Foreign Application Priority Data
Aug. 17, 2017   (KR) ........................ 10-2017-0103989

(51) Int. Cl.
| | | |
|---|---|---|
| *G11C 7/10* | (2006.01) | |
| *G11C 11/34* | (2006.01) | |
| *H03M 9/00* | (2006.01) | |
| *G06F 13/28* | (2006.01) | |
| *G06F 11/34* | (2006.01) | |

(52) U.S. Cl.
CPC .......... *G11C 11/34* (2013.01); *G06F 11/3476* (2013.01); *G06F 13/28* (2013.01); *H03M 9/00* (2013.01)

(58) Field of Classification Search
CPC ...... G11C 11/34; G06F 11/3476; G06F 13/28; H03M 9/00
USPC ........................ 365/189.02, 219, 221, 189.08
See application file for complete search history.

(56) References Cited

U.S. PATENT DOCUMENTS

| | | | | |
|---|---|---|---|---|
| 5,983,301 | A | * 11/1999 | Baker | .................... G06F 13/28 710/113 |
| 6,081,852 | A | * 6/2000 | Baker | .................... G06F 13/28 375/E7.025 |
| 6,594,609 | B1 | 7/2003 | Le et al. | |
| 6,798,420 | B1 | * 9/2004 | Xie | ........................ G06T 9/007 345/535 |
| 7,363,577 | B2 | 4/2008 | Kinser et al. | |

(Continued)

*Primary Examiner* — Viet Q Nguyen
(74) *Attorney, Agent, or Firm* — Harness, Dickey & Pierce, P.L.C.

(57) ABSTRACT

A semiconductor device includes a first serializer configured to collect at least one event in a first domain to generate a first serial data stream and transmit the first serial data stream periodically at a first period, a first de-serializer configured to receive the first serial data stream to restore the first serial data stream into first parallel data streams, the first parallel data stream encoding first parallel data items, a timer configured to provide a clock signal having a second period, a direct memory access (DMA) configured to capture the first parallel data items periodically at a second period using the clock signal to generate capture data items, and a first memory configured to store the capture data items. The addresses of the first memory at which the respective capture data items are stored are arranged in an order that the respective capture data items are captured.

20 Claims, 6 Drawing Sheets

(56) References Cited

U.S. PATENT DOCUMENTS

| | | | |
|---|---|---|---|
| 8,121,542 B2* | 2/2012 | Zack | H04B 1/40 455/41.1 |
| 8,255,595 B2 | 8/2012 | Stedman et al. | |
| 8,407,528 B2* | 3/2013 | Larson | G06F 11/3476 714/45 |
| 8,683,254 B2 | 3/2014 | Webb, III et al. | |
| 8,788,867 B2 | 7/2014 | Webb, III et al. | |
| 8,930,872 B2* | 1/2015 | Stark | G06F 17/5077 370/257 |
| 8,943,369 B2* | 1/2015 | Bansal | G06F 11/3476 714/45 |
| 8,996,889 B2 | 3/2015 | Consalus et al. | |
| 9,092,560 B2* | 7/2015 | Mayer | G06F 11/3476 |
| 9,158,720 B2* | 10/2015 | Shirlen | G06F 13/36 |
| 9,372,947 B1* | 6/2016 | Elmufdi | G06F 17/5027 |
| 9,635,398 B2 | 4/2017 | Ionescu | |
| 9,703,670 B2* | 7/2017 | Ajith Kumar | G06F 11/3495 |
| 9,830,245 B2* | 11/2017 | Hanssen | G06F 11/3476 |
| 2004/0139305 A1* | 7/2004 | Arimilli | G06F 9/30072 712/227 |
| 2004/0161040 A1* | 8/2004 | Schreiber | H04H 60/04 375/242 |
| 2006/0259822 A1* | 11/2006 | Swoboda | G06F 11/3636 714/38.13 |
| 2006/0259825 A1* | 11/2006 | Cruickshank | G06F 11/3419 714/38.1 |
| 2007/0143678 A1 | 6/2007 | Feigenbaum | |
| 2007/0174910 A1* | 7/2007 | Zachman | G06F 21/53 726/18 |
| 2008/0082760 A1 | 4/2008 | Onoue | |
| 2010/0332909 A1* | 12/2010 | Larson | G06F 11/3476 714/40 |
| 2011/0137909 A1 | 6/2011 | Guertler et al. | |
| 2012/0216080 A1* | 8/2012 | Bansal | G06F 11/3476 714/45 |
| 2013/0173539 A1* | 7/2013 | Gilder | G06F 16/273 707/622 |
| 2013/0219094 A1* | 8/2013 | Stark | G06F 13/20 710/107 |
| 2013/0219100 A1* | 8/2013 | Stark | G06F 17/5077 710/306 |
| 2013/0305012 A1 | 11/2013 | Hopley | |

\* cited by examiner

| 510 | |
|---|---|
| 256 bit event : 0ms | Start address |
| 256 bit event : 1ms | Start address + 0x020 |
| 256 bit event : 2ms | Start address + 0x040 |
| 256 bit event : 3ms | Start address + 0x060 |
| 256 bit event : 4ms | Start address + 0x080 |
| ⋮ | ⋮ |
| 256 bit event : (n-2)ms | End address - 0x40 |
| 256 bit event : (n-1)ms | End address - 0x20 |
| 256 bit event : n ms | End address |

SEMICONDUCTOR DEVICE AND METHOD FOR PROFILING EVENTS IN SEMICONDUCTOR DEVICE

This application claims priority from Korean Patent Application No. 10-2017-0103989 filed on Aug. 17, 2017, in the Korean Intellectual Property Office, the disclosure of which is incorporated herein by reference in its entirety.

BACKGROUND

Inventive concepts relate to a semiconductor device and/or a method for profiling events in a semiconductor device.

Traditionally, software has been used to profile events in a chip. In existing profiling schemes using software, changing the software into a debugging mode for the profiling or to enable a software profiler may be desirably. Accordingly, profiling events on-the-fly may be difficult, but the profiling is carried out only after the operation has been changed by software.

Furthermore, the profiling scheme using software checks the status of software, not the status of hardware, and thus monitoring hardware events may be difficult. When monitoring different events for different software structures, performing the profiling several times while changing debugging options may be inconvenient. In doing so, the extracted data items may have different periods, and thus analyzing the operations of system-on-chip (SoC) may be difficult.

SUMMARY

Some example embodiments of inventive concepts provide a semiconductor device capable of easily profiling events in a chip by using hardware configuration.

Some example embodiments of inventive concepts also provide a method for easily profiling events in a semiconductor device by using hardware configuration.

It should be noted that objects of inventive concepts are not limited to the above-described objects, and other objects inventive concepts may be apparent to those skilled in the art from the following descriptions.

According to an example embodiment of inventive concepts, there is provided a semiconductor device comprising a first serializer configured to collect at least one event in a first domain to generate a first serial data stream and transmit the first serial data stream during periodically at a first period, a first de-serializer configured to receive the first serial data stream to restore the first serial data stream into first parallel data streams, the first parallel data stream encoding first parallel data items, a timer configured to provide a clock signal having a second period, a direct memory access (DMA) configured to capture the first parallel data items periodically at a second period using the clock signal to generate capture data items, and a first memory configured to store the capture data items. The addresses of the first memory at which the respective capture data items are stored are arranged in an order that the respective capture data items are captured.

According to an example embodiment of inventive concepts, there is provided a semiconductor device comprising a first serializer configured to collect events in a first domain to generate a first serial data stream and transmit the first serial data stream periodically at a first period, a first de-serializer configured to receive the first serial data stream to restore the first serial data stream into first parallel data streams, a second serializer configured to collect events in a second domain to generate a second serial data stream and transmit the second serial data stream periodically at a second period, a second de-serializer configured to receive the second serial data stream to restore the second serial data stream into second parallel data streams, a first memory configured to store the first and second parallel data streams as integrated data, a timer configured to determine a capture frequency, a direct memory access (DMA) configured to generate capture data items from the integrated data according to the capture frequency, wherein the capture data items includes first to $n^{th}$ capture data items in an order the data items are captured, and a second memory configured to store the first to $n^{th}$ capture data items at first to $n^{th}$ addresses thereof, respectively. The first to $n^{th}$ addresses are arranged in the order the data items are captured.

According to an example embodiment of inventive concept, there is provided a method for profiling events in a semiconductor device, the method comprising collecting events in a first domain to generate a first serial data stream, updating the first serial data stream periodically at a first period, converting the first serial data stream into first parallel data streams to generate restored data, capturing the restored data at periodically at a second period to generate capture data items, and storing the capture data items. The capture data items are stored at addresses, respectively, that are arranged in an order that the capture data items are captured.

BRIEF DESCRIPTION OF THE DRAWINGS

The above and other aspects and features of inventive concepts will become more apparent by describing in detail example embodiments thereof with reference to the attached drawings, in which.

DETAILED DESCRIPTION OF THE EMBODIMENTS

Hereinafter, a semiconductor device according to some example embodiments of inventive concepts will be described with reference to FIGS. 1 to 4.

Figure 1:
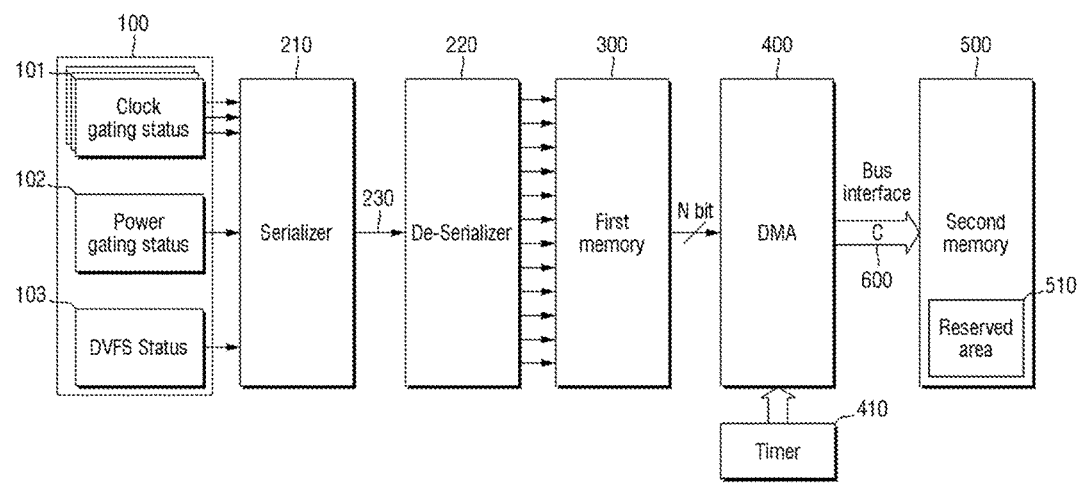
FIG. 1 is a block diagram for illustrating a semiconductor device according to some example embodiments of inventive concepts.
Figure 2:
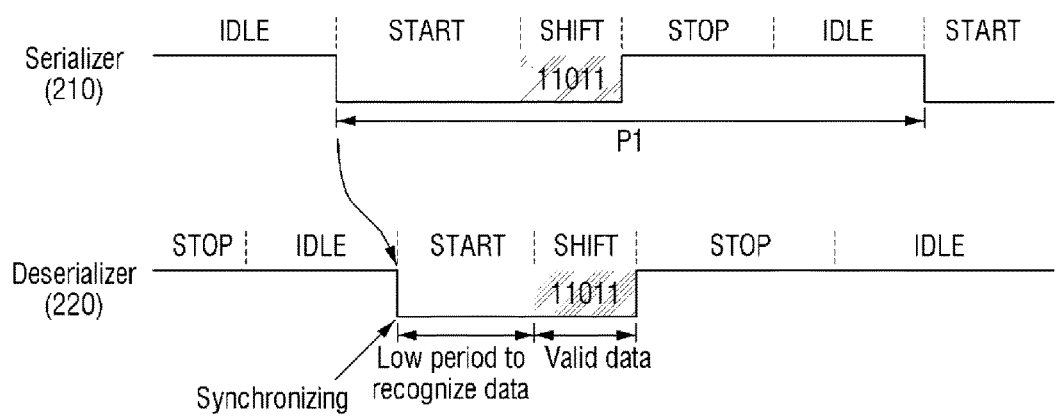
FIG. 2 is a timing diagram for illustrating operation of a serializer and a de-serializer of FIG. 1 in detail.
Figures 3, 4:
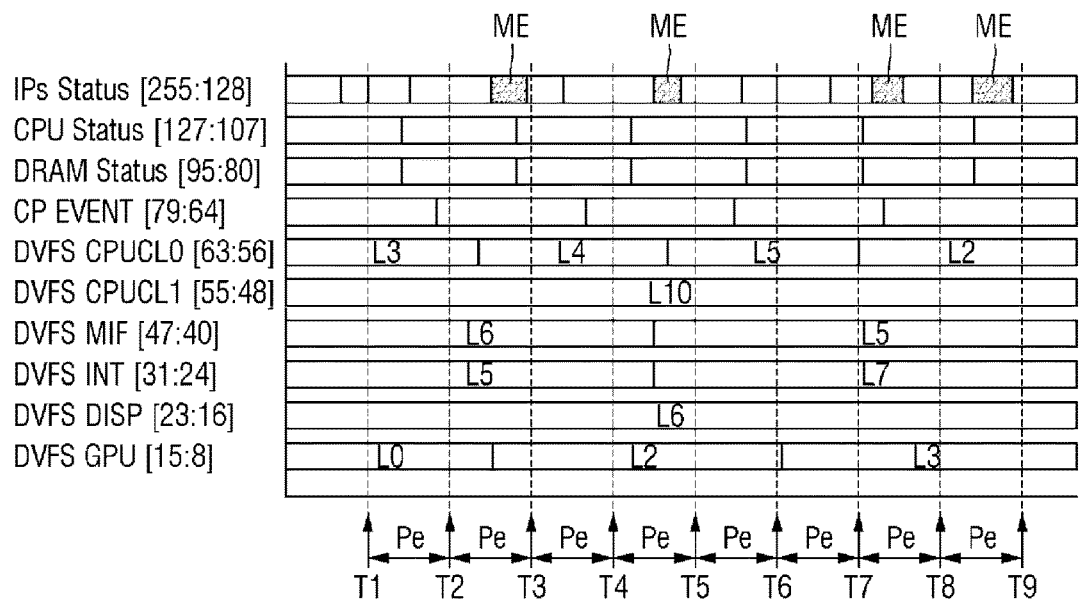
FIG. 3 is a diagram for conceptually illustrating parallel data restored by the de-serializer of FIG. 1.
FIG. 4 is a diagram illustrating addresses of capture data stored in a second memory of FIG. 1.

FIG. 1 is a block diagram for illustrating a semiconductor device according to some example embodiments of inventive concepts. FIG. 2 is a timing diagram for illustrating operation of a serializer and a de-serializer of FIG. 1 in detail. FIG. 3 is a diagram for conceptually illustrating parallel data restored by the de-serializer of FIG. 1. FIG. 4 is a diagram illustrating addresses of capture data items stored in a second memory of FIG. 1.

Referring to FIG. 1, a semiconductor device according to some example embodiments of inventive concepts includes a first event pool 100, a first serializer 210, a first de-serializer 220, a first wire 230, a first memory 300, a direct memory access (DMA) 400, a timer 410, a second memory 500, and a bus interface 600.

The first event pool 100 may refer to all the spaces of the semiconductor device in which events may take place. For example, a CPU, a memory or several intellectual property blocks (IPs) all may be included in the first event pool 100. In other words, the first event pool 100 may refer to a virtual location of the semiconductor device in which events may take place.

The first event pool 100 may include at least one event. The first event pool 100 may include first clock gating statuses 101, first power gating statuses 102 and first dynamic voltage and frequency scaling (DVFS) statuses 103. This is merely illustrative and is not intended to limit the scope of the inventive concepts.

The number of the first clock gating statuses 101 may be the largest, the number of the first power gating statuses 102 may be the second largest, and the number of the first DVFS statuses 103 may be the smallest. The numbers are not limited thereto.

The first serializer 210 may collect various events from the first event pool 100. The events may include at least one of the first clock gating statuses 101, the first power gating statuses 102 and the first DVFS statuses 103 described above.

The first serializer 210 may convert the collected events into one serial data stream. That is, the first clock gating statuses 101, the first power gating statuses 102 and the first DVFS statuses 103 collected by the first serializer 210 may be in the form of parallel data streams. Each of the parallel data streams may have different periods and may not be synchronized with one another.

The first serializer 210 may convert the parallel data streams into a single serial data stream and may transmit the serial data stream to the first de-serializer 220. When parallel data streams are transmitted, as many wires as the number of rows of the parallel data streams are required. When a serial data stream is transmitted, however, only one wire is required.

Accordingly, the first serializer 210 may transmit the serial data stream to the first de-serializer 220 via a first wire 230. The first wire 230 may have a single path.

The first de-serializer 220 may receive the serial data stream from the first serializer 210. Since the first de-serializer 220 is connected to the first serializer 210 via the first wire 230, the first deserializer 22 may receive one input serially via the first wire 230.

Referring to FIG. 2, the first serializer 210 may transmit data to the first de-serializer 220 when the first serializer 210 enters a start state START from in an idle state IDLE. Dummy data may be transmitted prior to valid data in the start state START for synchronization. Valid data may be transmitted serially following the dummy data in a shift state SHIFT.

Subsequently, data transmission may be interrupted in a stop state STOP, followed by the idle state IDLE again. The states until the idle state IDLE may be repeated as a first period P1. For example, the period from one start state START to another may be defined as the first period P1 and may be repeated, that is, repeated periodically.

Similarly, the first de-serializer 220 enters the start state START from the idle state IDLE when data is transmitted and may receive dummy data and recognize the data. In recognizing the data, the first de-serializer 220 can recognize from where the valid data starts.

Referring back to FIG. 1, the first serializer 210 may periodically update, i.e., transmit, serial data with the first period P1. The first de-serializer 220 may receive the serial data at every first period P1.

By combining the first serializer 210 with the first de-serializer 220, reducing the use of unnecessary wires may be possible. For example, the semiconductor device according to some example embodiments of inventive concepts can perform event profiling by using hardware specifications as small as possible.

The first de-serializer 220 may restore the received serial data stream back to original parallel data streams. The first de-serializer 220 may store the restored parallel data streams in the first memory 300.

FIG. 3 shows an example of the parallel data streams stored in the first memory 300. The parallel data streams may have different kinds of events included IPs status, CPU status, etc. Such parallel data streams are not synchronized with one another at all and thus may be a simple set of discrete data streams having different periods.

The first memory 300 may temporarily store the parallel data streams. The first memory 300 may be or may include at least one of, for example, a flip-flop and a static random access memory (SRAM); however, inventive concepts are not limited thereto.

Referring back to FIG. 1, the DMA 400 may retrieve the parallel data streams stored in the first memory 300. The DMA 400 may capture the parallel data streams over time. As used herein, the operation of "capturing" refers to logging data at a specific time point as it is. Each event changes over time, and the parallel data streams store all of these changes. On the contrary, the "captured" data does not store changes over time, but can only contain the data at the time point it is captured.

The DMA 400 may perform capturing at first to ninth time points T1 to T9 of FIG. 3, for example. The first to ninth time points T1 to T9 may arranged at equal intervals. The equal intervals may be capturing period Pe and may be defined by a timer 410.

The timer 410 may provide the capturing period Pe or a capture frequency 1/Pe to the DMA 400. The capturing period Pe may be increased or decreased, for example, may be increased or decreased as desired. For example, in order to acquire more detailed event information, arranging the first to ninth time points T1 to T9 more densely at a smaller capturing period Pe may be possible.

On the other hand, in order to acquire event information of a smaller capacity, it is possible to arrange the first to ninth time points T1 to T9 more sparsely at a larger capturing period Pe.

Referring to FIG. 3, there may be missing events ME depending on the capturing period Pe. A missing event ME takes place when a value of an event is changed and isolated between adjacent capture time points For example, referring to IPs status of FIG. 3, there is a value that has been changed and changed again between the second time point T2 and the third time point T3. The data captured at the second time point T2 and at the third time point T3 cannot include such a change and thus there may be a missing event ME.

Accordingly, according to some example embodiments of inventive concepts, in order to prevent, or reduce the likelihood of, a missing event ME, the capturing period Pe can be made smaller than the period of events.

Or, according to some example embodiments of inventive concepts, in order to observe the general trend with data of a lower capacity, the capturing period Pe can be made larger despite missing events ME.

Referring back to FIG. 1, the DMA 400 may store capture data items in the second memory 500 via the bus interface 600. The capture data items may be captured at each of the first to ninth time points T1 to T9.

The second memory 500 may store the parallel data streams by the DMA 400. The second memory 500 may include at least one of a dynamic random access memory (DRAM), a static random access memory (SRAM), and a flash memory.

The second memory 500 may include a reserved area 510. In the reserved area 510, the capture data items may be stored by the DMA 400. The size of the reserved area 510 may be equal to the size of the capture data items. For example, the size of the reserved area 510 may be determined depending on the size of the capture data items and the number of time points of capturing.

The bus interface 600 may connect the DMA 400 with the second memory 500. The bus interface 600 may be not only utilized as a path between the DMA 400 and the second memory 500 but also may provide a connection between other elements in the semiconductor device; however, inventive concepts are not limited thereto.

Conventionally, in order for a DMA to store data in the memory, in addition to the actual data, address data to indicate which area of the memory the actual data is to be stored may be desirable or necessary. Therefore, data having a larger capacity than the capacity of the actual data may be required.

In contrast, the DMA 400 of the semiconductor device according to some example embodiments of inventive concepts may automatically store the parallel data streams sequentially at the capturing times, i.e., the first to ninth time points T1 to T9. The capture data items may be stored in the reserved area 510 of the second memory 500.

Specifically, referring to FIG. 4, the capture data item captured at the first time point T1 may be stored at a Start address. Subsequently, the capture data item captured at the second time point T2 may be stored at an address incremented by 0x020 from the Start address (Start address+ 0x020). Subsequently, the capture data item captured at the third time point T3 may be stored at an address incremented by 0x040 from the Start address (Start address+0x040). Subsequently, the capture data item captured at the fourth time point T4 may be stored at an address incremented by 0x060 from the Start address (Start address+0x060). Subsequently, the capture data item captured at the fourth time point T5 may be stored at an address incremented by 0x080 from the Start address (Start address+0x080).

Accordingly, the addresses where the capture data items are stored, respectively, can be equally spaced apart from one another. Also, the addresses may be arranged in the chronological order according to the first to ninth time points T1 to T9. For example, the data captured at the second time point T2 between the first time point T1 and the third time point T3 may be stored in an address (Start address+0x020) between the address (Start address) at which the data captured at the first time point T1 is stored and the address (Start address+0x040) at which the data captured at the third time point T3 is stored.

Although the capturing period Pe is 1 ms and the size of the capture data items is 256 bits in FIG. 4, this is merely illustrative and is not intended to the scope of the inventive concepts.

As described above, the stored events may not include the information on the missing events ME. Therefore, even by reading the reserved area 510 of the second memory 500 later, it is not possible to check the information on the missing events ME. In this regard, by reducing the capturing period Pe, preventing, or reducing the likelihood of, the occurrence of such missing events ME, may be possible.

Referring again to FIG. 1, the DMA 400 may sequentially read the capture data items stored in the reserved area 510 of the second memory 500. By doing so, checking the events over times in hardware may be possible.

Since the semiconductor device according to some example embodiments of inventive concepts can profile events in hardware, no software intervention is necessarily required. When the event profiling is carried out in software, events can be profiled only when the software is operating. In contrast, according to the example embodiment of the inventive concepts, every event can be collected in hardware irrespectively of the operation of software.

In addition, the profiling in software exerts a work load to the CPU, which may degrade the performance and speed of the semiconductor device. In contrast, according to the example embodiment of the inventive concepts, the events are profiled only in hardware, and thus the burden on the CPU can be reduced.

Further, since the profiling in software may require various drivers for the respective types of the events, using such a plurality of drivers may be necessary. In contrast, according to the example embodiment of the inventive concepts, profiling the events only with capture data items may be possible.

Moreover, for the profiling by software, monitoring operation itself causes a change in the behavior of the device and thus intuitive event profiling may be difficult or impossible. In contrast, the semiconductor device according to the example embodiment of the inventive concepts may profile events directly in hardware, allowing for intuitive event profiling.

Hereinafter, a semiconductor device according to some example embodiments of inventive concepts will be described with reference to FIGS. 5 to 6. Descriptions of the identical elements described above will be omitted or briefly described to avoid redundancy.

Figure 5:
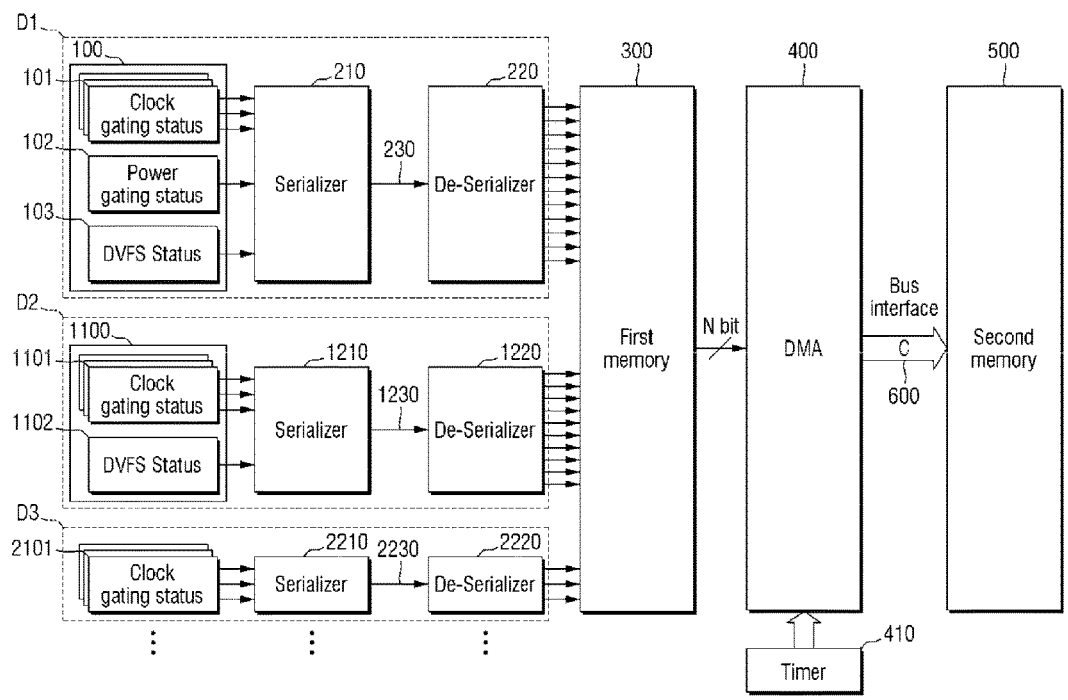
FIG. 5 is a block diagram for illustrating a semiconductor device according to some example embodiments of inventive concepts.

FIG. 5 is a block diagram for illustrating a semiconductor device according to some example embodiments of inventive concepts. FIG. 6 is a timing diagram for illustrating operation of a serializer and a de-serializer of FIG. 5 in detail.

Referring to FIG. 5, a semiconductor device according to some example embodiments of inventive concepts may include first to third domains D1 to D3.

The first domain D1 may include a first event pool 100, a first serializer 210, and a first de-serializer 220. The second domain D2 may include a second event pool 1100, a second serializer 1210, and a second de-serializer 1220. The third domain D3 may include a third event pool 2100, a third serializer 2210, and a third de-serializer 2220.

Although three domains are shown in FIG. 5, the number of the domains is not limited to three. For example, the semiconductor device according to some example embodiments of inventive concepts may include two domains or four or more domains. For example, the semiconductor device may include more than one domains.

The first domain D1 may have a configuration similar to that described above with reference to FIG. 1. The second event pool 1100 of the second domain D2 may be or may include a space separated from the first event pool 100. The second event pool 1100 may be or may include an area where events are not collected by the first serializer 210. The second event pool 1100 may include second clock gating statuses 1101 and a second DVFS status 1102. As shown in FIG. 5, the second event pool 1100 may include a different type and number of events than the first event pool 100; however, inventive concepts are not limited thereto.

The second serializer 1210 may collect various events from the second event pool 1100. The second serializer 1210 may convert the collected parallel data streams into a single serial data stream and may transmit it to the second de-serializer 1220. The second serializer 1210 may transmit the serial data stream to the second de-serializer 1220 via a second wire 1230. The second wire 1230 may have a single path.

The third event pool 2100 of the third domain D3 may be or may include a space separated from the first event pool 100 and from the second event pool 1100. The third event pool 2100 may be or may include an area where events are collected neither by the first serializer 210 nor by the second serializer 1210. The third event pool 2100 may include third clock gating statuses 2101. As shown in FIG. 5, the third event pool 1100 may include a different type and number of events than the first event pool 100 and the second event pool 1100; however, inventive concepts are not limited thereto.

The third serializer 2210 may collect various events from the third event pool 2100. The third serializer 2210 may convert the collected parallel data streams into a single serial data stream and may transmit it to the third de-serializer 2220. The third serializer 2210 may transmit the serial data stream to the third de-serializer 2230 via a third wire 2220. The third wire 2230 may have a single path.

Figure 6:
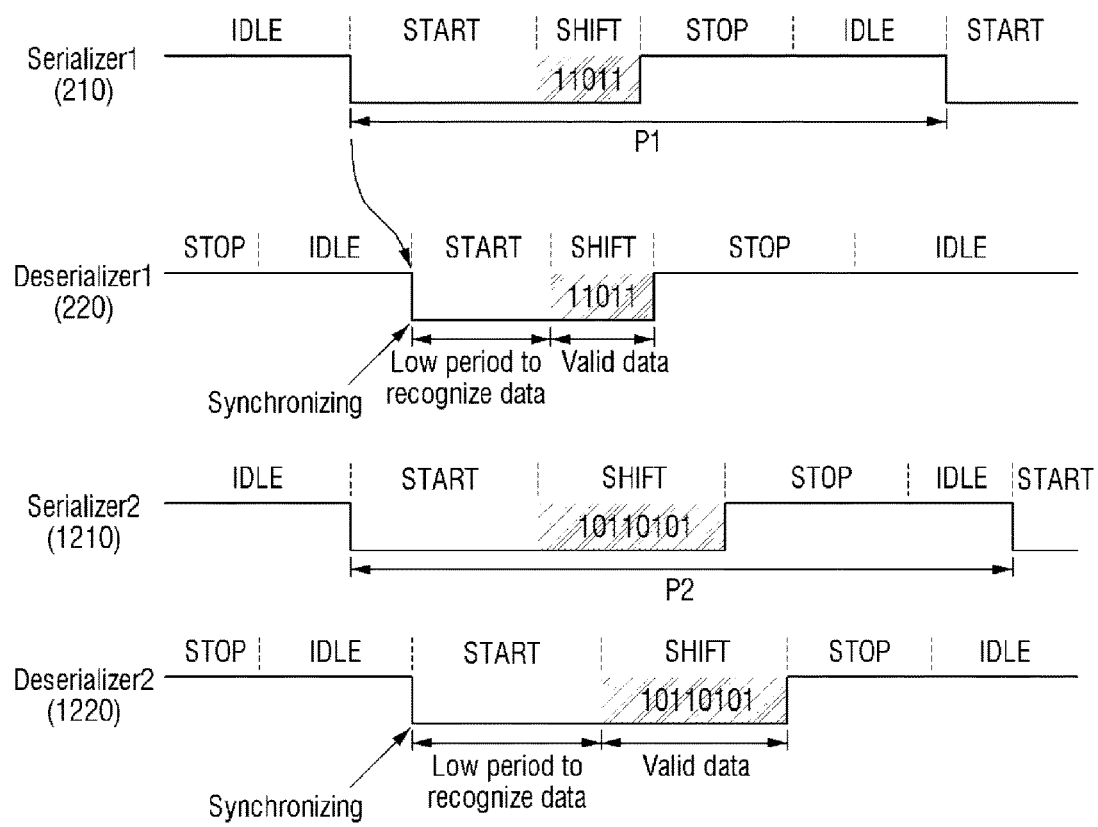
FIG. 6 is a timing diagram for illustrating operation of a serializer and a de-serializer of FIG. 5 in detail.

Referring to FIG. 6, operations of the first serializer 210 and the first de-serializer 220 may be similar with operations of the second serializer 1210 and the second de-serializer 1220, respectively. For example, the operations of the first serializer 210 and the first de-serializer 220 and the operations of the second serializer 1210 and the second de-serializer 1220 may be performed by repeating the operations in the states IDLE, START, SHIFT and STOP.

The first serializer 210 and the second serializer 1210 may operate with different periods. For example, the first serializer 210 may transmit the serial data stream periodically with the first period P1 while the second serializer 1210 may transmit the serial data stream periodically with the second period P2.

As a result, the timing of updating the first serializer 210 and the timing of updating the second serializer 1210 may not be synchronized with each other. In the semiconductor device according to some example embodiments of inventive concepts, the parallel data streams can be restored later even if the serializers operate separately in different domains without synchronization, and thus it is not necessary to synchronize timings at the serializer level. Accordingly, events can be profiled more freely with less resources.

Referring again to FIG. 5, the first to third serializers 210, 1210 and 2210 in the first to third domains D1 to D3 may transmit serial data streams with different periods, respectively, and the first to third de-serializers 210, 1220 and 2220 may also receive the serial data streams with different periods.

The first to third de-serializers 220, 1220 and 2220 may restore the received serial data streams back to parallel data streams. At this time, the first to third de-serializers 220, 1220 and 2220 may combine the restored parallel data streams to generate a single integrated data. This integrated data may be stored in the first memory 300.

The DMA 400 may capture the integrated data according to a capturing period provided by the timer 410 and store it in the second memory 500. In doing so, the addresses of the capture data items to be stored may be sequentially arranged according to the order of the time points of capturing.

In the semiconductor device according to some example embodiments of inventive concepts, serializers may collect events independently in different domains. A domain may be defined as a set of adjacent areas of the semiconductor device or may be defined by connecting areas to achieve the shortest signal path. That is, the domains may be defined to collect events efficiently so as to increase the efficiency of event profiling.

According to the example embodiment of the inventive concepts, since the domains collect event independently, the semiconductor device may not require clock signals may not require a buffer time for synchronization, and may not require a logic module for synchronization. Therefore, event profiling may be carried out quickly with fewer resources.

Hereinafter, a method for profiling events in a semiconductor device according to the example embodiment of the inventive concepts will be described with reference to FIGS. 1, 3, 4, 7 and 8. Descriptions of the identical elements described above will be omitted or briefly described to avoid redundancy.

Figure 7:
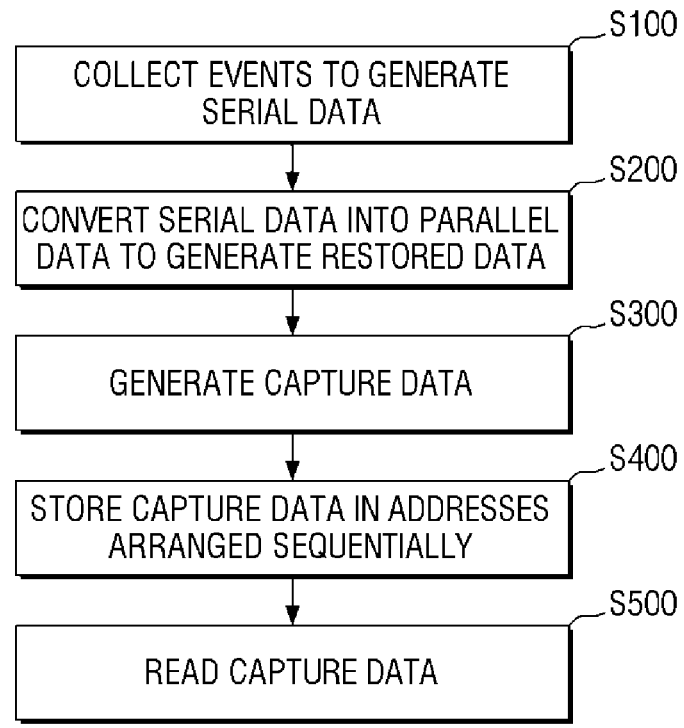
FIG. 7 is a flowchart for illustrating a method for profiling event by a semiconductor device according to some example embodiments of inventive concepts.
Figure 8:
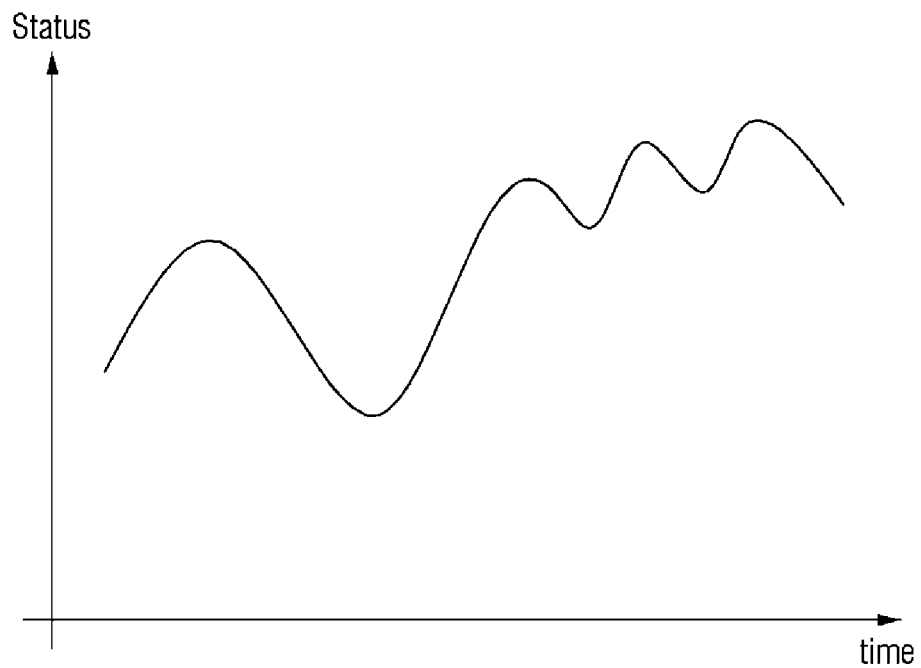
FIG. 8 is a graph showing read capture data of FIG. 7.

FIG. 7 is a flowchart for illustrating a method for profiling events in a semiconductor device according to some example embodiments of inventive concepts. FIG. 8 is a graph showing read capture data items of FIG. 7.

Referring initially to FIG. 7, serial data may be generated by collecting events, as in in step S100.

Specifically, referring to FIG. 1, the first serializer 210 may collect various events from the first event pool 100. The events may include at least one of the first clock gating statuses 101, the first power gating statuses 102 and the first DVFS statuses 103 described above. The first serializer 210 may convert the collected events into one serial data stream.

Referring again to FIG. 7, the serial data is converted into parallel data streams to generate restored data, as in step S200.

Specifically, referring to FIG. 1, the first de-serializer 220 may restore the received serial data stream back to the original parallel data streams.

Referring again to FIG. 7, capture data items are generated, as in step S300.

Specifically, referring to FIGS. 1 and 3, the DMA 400 may capture the parallel data streams over time. The DMA 400 may perform capturing at first to ninth time points T1 to T9 of FIG. 3, for example. The first to ninth time points T1 to T9 may arranged at equal intervals. The equal intervals may be capturing period Pe and may be defined by a timer 410.

Referring again to FIG. 7, the capture data items are stored sequentially in the respective addresses, as in step S400.

Specifically, referring to FIGS. 1 and 4, the capture data item captured at the first time point T1 may be stored at a Start address. Subsequently, the capture data item captured at the second time point T2 may be stored at an address incremented by 0x020 from the Start address (Start address+ 0x020). Subsequently, the capture data item captured at the third time point T3 may be stored at an address incremented by 0x040 from the Start address (Start address+0x040). Subsequently, the capture data item captured at the fourth time point T4 may be stored at an address incremented by 0x060 from the Start address (Start address+0x060). Subsequently, the capture data item captured at the fourth time point T5 may be stored at an address incremented by 0x080 from the Start address (Start address+0x080).

Accordingly, the addresses where the capture data items are stored, respectively, can be equally spaced apart from one another.

Referring again to FIG. 7, the capture data items are read, as in step S500.

Specifically, referring to FIG. 8, the capture data items may be expressed graphically as in the graph shown in FIG. 8. The capture data items may also be expressed in different ways. Such representation of the capture data items may be utilized for monitoring the events.

Hereinafter, a method for profiling events in a semiconductor device according to the example embodiment of the inventive concepts will be described with reference to FIGS. 5, 7 and 9. Descriptions of the identical elements described above will be omitted or briefly described to avoid redundancy.

Figure 9:
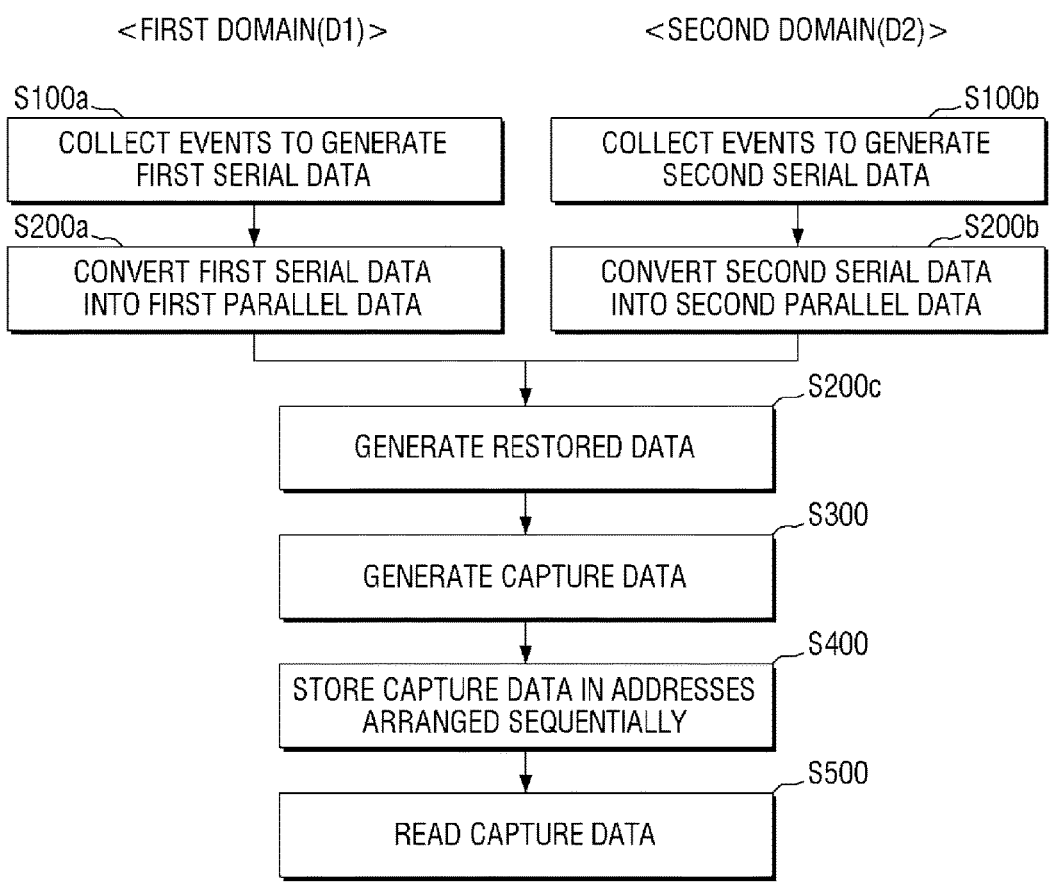
FIG. 9 is a flowchart for illustrating a method for profiling event by a semiconductor device according to some example embodiments of inventive concepts.

FIG. 9 is a flowchart for illustrating a method for profiling event by a semiconductor device according to some example embodiments of inventive concepts.

Referring to FIG. 9, operations may be performed independently in the first domain D1 and the second domain D2. The first domain D1 will be described firstly, and then the second domain D2 will be described.

Initially, a first serial data stream is generated by collecting events (step S100a).

Specifically, referring to FIG. 5, the first serializer 210 collects events in the first domain D1 to generate first serial data stream.

Referring again to FIG. 9, the first serial data stream is converted into first parallel data streams, as in step S200a.

Specifically, referring to FIG. 5, the first de-serializer 220 may convert the received first serial data stream into the first parallel data streams in the first domain D1.

Hereinafter, the second domain D2 will be described.

Referring again to FIG. 9, events are collected to generate a second serial data stream (step S100b).

Specifically, referring to FIG. 5, the second serializer 1210 collects events in the second domain D2 to generate the second serial data stream.

Referring again to FIG. 9, the second serial data stream may be converted into second parallel data streams, as in step S200b.

Specifically, referring to FIG. 5, the second de-serializer 1220 may convert the received second serial data stream into the second parallel data streams in the second domain D2.

Referring again to FIG. 9, restored data is generated (step S200c).

The restored data may be generated by integrating the first parallel data streams and the second parallel data stream.

Subsequently, the method for profiling events in a semiconductor device according to the example embodiment of the inventive concepts may include generating capture data items (step S300), storing the capture data items at the respective addresses (step S400), and reading out the capture data items (step S500).

According to the method for profiling events in a semiconductor device according to the example embodiment of the inventive concepts, event are collected independently in different domains, such that event profiling can be carried out quickly with reduced or minimal resources.

What is claimed is:

1. A semiconductor device comprising:
a first serializer configured to collect events in a first domain to generate a first serial data stream and transmit the first serial data stream periodically at a first period;
a first de-serializer configured to receive the first serial data stream to convert the first serial data stream into first parallel data streams;
a timer configured to provide a clock signal having a second period;
a direct memory access (DMA) configured to capture the first parallel data streams periodically at the second period using the clock signal to generate capture data items; and
a first memory configured to store the capture data items,
wherein addresses of the first memory at which respective ones of the capture data items are stored are arranged in an order that the respective capture data items are captured.

2. The semiconductor device of claim 1, wherein the events includes at least one of a clock gating status, a power gating status, and a dynamic voltage and frequency scaling (DVFS) status.

3. The semiconductor device of claim 1, further comprising:
a second serializer configured to collect events in a second domain different from the first domain to generate a second serial data stream and to transmit the second serial data stream periodically at a third period; and
a second de-serializer configured to receive the second serial data stream to restore the second serial data stream into second parallel data streams,
wherein the DMA captures the first and second parallel data streams periodically at the second period to generate the capture data items.

4. The semiconductor device of claim 3, wherein the first period is different from the third period.

5. The semiconductor device of claim 3, further comprising:
a second memory configured to store the first and second parallel data streams.

6. The semiconductor device of claim 5, wherein a time point at which the second memory stores the first parallel data streams is different from a time point at which the second memory stores the second parallel data streams.

7. The semiconductor device of claim 1, wherein the DMA is configured to store,
a first capture data item captured at a first address at a first time point,
a second capture data item captured at a second address at a second time point after the second period has elapsed since the first time point, and
a third capture data item captured at a third address at a third time point after the second period has elapsed since the second time point, and
wherein a difference between the second address and the first address is equal to a difference between the third address and the second address.

8. The semiconductor device of claim 1, wherein the second period is smaller than a smallest one of periods of the events.

9. A semiconductor device comprising:
a first serializer configured to collect events in a first domain to generate a first serial data stream and transmit the first serial data stream periodically at a first period;
a first de-serializer configured to receive the first serial data stream to convert the first serial data stream into first parallel data streams;
a second serializer configured to collect events in a second domain to generate a second serial data stream and transmit the second serial data stream periodically at a second period;
a second de-serializer configured to receive the second serial data stream to convert the second serial data stream into second parallel data streams;
a first memory configured to store the first and second parallel data streams as integrated data;
a timer configured to determine a capture frequency;
a direct memory access (DMA) configured to generate capture data items from the integrated data according to the capture frequency, wherein the capture data items includes first to $n^{th}$ capture data items in an order the data items are captured; and
a second memory configured to store the first to $n^{th}$ capture data items at first to $n^{th}$ addresses thereof, respectively,
wherein the first to $n^{th}$ addresses are arranged in the order the data items are captured.

10. The semiconductor device of claim 9, wherein the first to $n^{th}$ addresses are equally spaced apart from one another.

11. The semiconductor device of claim 9, wherein the first to $n^{th}$ capture data items all have a same size.

12. The semiconductor device of claim 11, wherein the first memory comprises at least one of a flip-flop or an SRAM.

13. The semiconductor device of claim 11, wherein the second memory comprises at least one of a DRAM, a SRAM or a flash memory.

14. The semiconductor device of claim 11, wherein the first period is different from the second period.

15. A method for profiling events in a semiconductor device, the method comprising:
collecting events in a first domain to generate a first serial data stream;
updating the first serial data stream periodically at a first period;
converting the first serial data stream into first parallel data streams to generate converted data;
capturing the converted data periodically at a second period to generate capture data items; and
storing the capture data items,
wherein the capture data items are stored at addresses, respectively, that are arranged in an order that the capture data items are captured.

16. The method of claim 15, further comprising:
collecting events in a second domain different from the first domain to generate a second serial data stream;
updating the second serial data stream periodically at a third period; and
converting the second serial data stream into second parallel data streams,
wherein the converting the first and second serial data streams into first and second parallel data streams data includes integrating the first and second parallel data streams.

17. The method of claim 16, wherein the first period is different from the third period.

18. The method of claim 15, wherein the events include at least one of a clock gating status, a power gating status, and a dynamic voltage and frequency scaling (DVFS) status.

19. The method of claim 15, wherein the addresses are equally spaced apart from one another.

20. The method of claim 15, further comprising:
reading out the capture data items sequentially to display the events graphically.

* * * * *